(12) United States Patent
Lin et al.

(10) Patent No.: US 10,777,876 B2
(45) Date of Patent: Sep. 15, 2020

(54) ANTENNA FEEDER PACKAGE STRUCTURE AND PACKAGING METHOD

(71) Applicant: SJ Semiconductor(Jiangyin) Corporation, Jiangyin (CN)

(72) Inventors: Jangshen Lin, Jiangyin (CN); Yenheng Chen, Jiangyin (CN); Chengchung Lin, Jiangyin (CN); Chengtar Wu, Jiangyin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 0 days.

(21) Appl. No.: 16/354,477

(22) Filed: Mar. 15, 2019

(65) Prior Publication Data

US 2019/0288374 A1    Sep. 19, 2019

Related U.S. Application Data

(63) Continuation of application No. 16/286,310, filed on Feb. 26, 2019.

(51) Int. Cl.
| | |
|---|---|
| *H01L 23/48* | (2006.01) |
| *H01Q 1/22* | (2006.01) |
| *H01L 23/66* | (2006.01) |
| *H01L 23/00* | (2006.01) |
| *H01L 23/498* | (2006.01) |
| *H01L 21/48* | (2006.01) |
| *H01L 21/683* | (2006.01) |

(52) U.S. Cl.
CPC ......... *H01Q 1/2283* (2013.01); *H01L 21/486* (2013.01); *H01L 21/4857* (2013.01); *H01L 23/49816* (2013.01); *H01L 23/49822* (2013.01); *H01L 23/49894* (2013.01); *H01L 23/66* (2013.01); *H01L 24/16* (2013.01); *H01L 24/81* (2013.01); *H01L 21/6835* (2013.01); *H01L 2221/68318* (2013.01); *H01L 2221/68345* (2013.01); *H01L 2221/68359* (2013.01); *H01L 2221/68372* (2013.01); *H01L 2223/6611* (2013.01); *H01L 2223/6677* (2013.01); *H01L 2924/014* (2013.01); *H01L 2924/1579* (2013.01); *H01L 2924/15184* (2013.01); *H01L 2924/15788* (2013.01)

(58) Field of Classification Search
CPC .............. H01L 21/4857; H01L 21/486; H01L 2223/6677; H01L 2223/6611; H01L 2221/68318; H01Q 1/2283
USPC ........................................................ 257/737
See application file for complete search history.

(56) References Cited

U.S. PATENT DOCUMENTS

| | | | | |
|---|---|---|---|---|
| 6,946,380 B2 * | 9/2005 | Takahashi | ......... | H01L 23/49575 438/612 |
| 2006/0049995 A1 * | 3/2006 | Imaoka | .................... | H01Q 1/22 343/702 |
| 2010/0327068 A1 * | 12/2010 | Chen | ................ | G06K 19/07749 235/492 |
| 2013/0292808 A1 * | 11/2013 | Yen | ........................ | H01L 23/552 257/660 |

(Continued)

*Primary Examiner* — Nitin Parekh
(74) *Attorney, Agent, or Firm* — Alston & Bird LLP

(57) ABSTRACT

The present disclosure provides an antenna package structure and packaging method. The package structure includes: a metal joint pin fabricated by using a wire bonding process; and a packaging layer, covering the metal joint pin. An antenna circuit chip and an antenna metal layer are electrically connected to two ends of the antenna feeder package structure.

4 Claims, 8 Drawing Sheets

(56) References Cited

U.S. PATENT DOCUMENTS

| | | | |
|---|---|---|---|
| 2014/0104133 A1* | 4/2014 | Finn | G06K 19/07769 |
| | | | 343/866 |
| 2015/0364445 A1* | 12/2015 | Choi | H01L 23/66 |
| | | | 257/664 |
| 2018/0019197 A1* | 1/2018 | Boyapati | H01L 23/5383 |
| 2018/0158787 A1* | 6/2018 | Chang | H01L 21/4857 |
| 2018/0358685 A1* | 12/2018 | Han | H01Q 1/2283 |
| 2019/0035749 A1* | 1/2019 | Dalmia | H01Q 1/2283 |
| 2019/0139915 A1* | 5/2019 | Dalmia | H01L 23/42 |
| 2019/0173195 A1* | 6/2019 | Kim | H01Q 21/28 |

* cited by examiner

ANTENNA FEEDER PACKAGE STRUCTURE AND PACKAGING METHOD

CROSS REFERENCES TO RELATED APPLICATIONS

This application is a continuation of the U.S. patent application Ser. No. 16/286,310. This application claims the benefits of priority to Chinese Patent Application No. CN2018102175884X, entitled "Packaging Structure and Packaging Method for Antenna", filed with CNIPA on Mar. 16, 2018, Chinese Patent Application No. CN2018203598256, entitled "Packaging Structure for Antenna", filed with CNIPA on Mar. 16, 2018, Chinese Patent Application No. CN2018113259510, entitled "Antenna Feeder Package Structure and Antenna Feeder Packaging Method", filed with CNIPA on Nov. 8, 2018, and U.S. patent application Ser. No. 16/286,310, entitled "Packaging Structure and Packaging Method for Antenna", filed with USPTO on Feb. 26, 2019, the contents of which are incorporated herein by reference in its entirety.

TECHNICAL FIELD

The present disclosure relates to the field of semiconductor packaging technology, and in particular, to an antenna feeder package structure and a method of making thereof.

BACKGROUND

With the advancement of science and technologies, various high-tech electronic products, including various electronic apparatuses such as notebook computers, mobile phones, and tablet computers (PAD), have been developed to meet people's needs.

In addition to significant increases in functions and applications enabled by these high-tech products, a wireless communication function needs to meet mobile device requirements, so people may use these high-tech electronic products anywhere and anytime using the wireless communication functions. Flexibility and convenience of these high-tech electronic products have been significantly improved. Today people no longer need to call from limited areas, and their lives are benefited because of application of these electronic products.

In general, wireless communication involves antennas. Existing antenna structures on IC circuits include dipole antenna, monopole antenna, patch antenna, planar inverted-F antenna, meander line antenna, inverted-L antenna, loop antenna, spiral antenna, spring antenna, and the like. A known approach manufactures an antenna directly on the surface of a circuit board. In this approach, the antenna may occupy an additional area of the circuit board, which is relatively undesirable. For various electronic apparatus, a large circuit board results in a large electronic apparatus. However, a main purpose of designing and developing these electronic apparatus is to enable a user to conveniently carry the electronic apparatuses. Therefore, a problem to be solved is to reduce the antenna structure area on circuit boards thereby improving integration performance.

In addition, most of existing antennas have a single-layer packaging structure. These antennas have low efficiency, and cannot meet the increasing requirements on antenna performance. Moreover, in an existing packaging manner, an antenna feeder is packaged by using a PCB substrate. Holes are provided in a PCB substrate by means of mechanical drilling or laser drilling, and then metal is filled in the holes by means of chemical plating or electroplating, thereby packaging the antenna feeder. In this packaging manner, side walls of the antenna feeder are rough because the holes obtained through drilling have rough side walls. Rough side walls result in severe loss of signals sent and received by the antenna and hence degrade electrical properties of the antenna package. In addition, because the antenna feeder is fabricated in the PCB substrate, it is impossible to fabricate a long antenna feeder, meanwhile the fabrication cost is high.

Based on the foregoing descriptions, it is necessary to provide an appropriate antenna package structure and a method to make it.

SUMMARY

The present disclosure provides an antenna feeder package structure. The antenna feeder package structure comprises: a patterned antenna metal layer on a substrate; a metal joint pin fabricated aligned to the patterned antenna metal layer by using a wire bonding process; and a packaging layer, covering the metal joint pin.

Optionally, the metal joint pin is made of gold, silver, copper, or aluminum.

Optionally, the packaging layer is made of polyimide, silica gel, or epoxy resin.

Optionally, a top surface of the packaging layer comprises a flat surface.

Optionally, the antenna feeder package structure further comprises at least two metal joint pin layers and another packaging layer, wherein each of the at least two metal joint pin layers comprises a plurality of the metal joint pins.

The present disclosure further provides a method for fabricating an antenna feeder package. The method for fabricating an antenna feeder package comprises: providing a patterned conductive layer; forming a metal joint by using a wire bonding process; and covering the metal joint pin with a packaging layer.

Optionally, the conductive layer comprises a redistribution layer or an antenna metal layer.

Optionally, the wire bonding process comprises one of a thermos-compression bonding process, an ultrasonic wire bonding process, and a thermos-compression ultrasonic wire bonding process.

Optionally, a method for covering the metal joint pin with the packaging layer comprises one of compression molding, transfer molding, hydro-forming, vacuum lamination and spin coating.

Optionally, a top surface of the packaging layer is planarized by means of polishing or grinding.

Optionally, the antenna feeder package further comprises at least two metal joint pin layers and at least two of the packaging layers.

DESCRIPTIONS OF REFERENCE NUMERALS

Figure 1:
FIG. 1 to FIG. 14 show the steps of fabricating an antenna package and sequential structural diagrams according to an embodiment in the present disclosure.

101 Supporting substrate
102 Separation layer

103 First Antenna metal layer
104 First Metal joint pin
105 First Packaging layer
106 Second Antenna metal layer
107 Second Metal joint pin
108 Second Packaging layer
109 Redistribution layer
110 Metal bump
111 Antenna circuit chip
112 Bottom filling layer

DETAILED DESCRIPTION OF THE PREFERRED EMBODIMENTS

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

Embodiment 1

Figure 28:
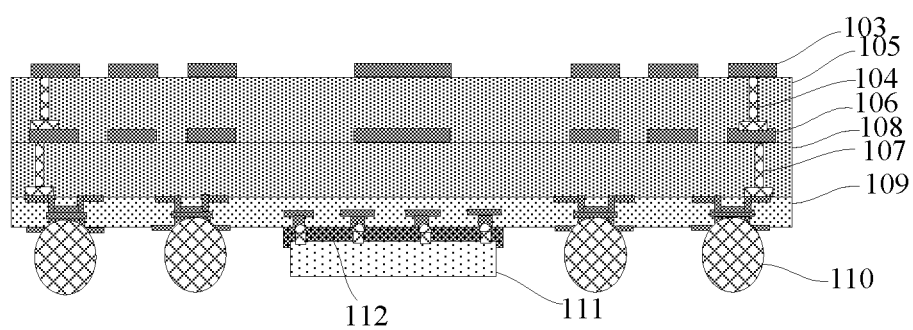
FIG. 28 shows the structural diagram of an antenna package according to the embodiment in FIGS. 15-27.

As shown in FIG. 28, the present embodiment provides a packaging structure for an antenna. The packaging structure comprises a redistribution layer 109, a second metal joint pin 107, a second packaging layer 108, a second antenna metal layer 106, a first metal joint pin 104, a first packaging layer 105, a first antenna metal layer 103, a metal bump 110, an antenna circuit chip 111, and a bottom filling layer 112.

As shown in FIG. 28, the redistribution layer 109 has a first surface facing the chip and an opposite second surface.

As shown in FIG. 28, the redistribution layer 109 comprises a patterned first dielectric layer (not shown in the figures), a patterned first metal wiring layer (not shown in the figures), a patterned second dielectric layer (not shown in the figures), and a patterned second metal wiring layer (not shown in the figures) which are sequentially stacked, wherein the first metal wiring layer is electrically connected with the second metal wiring layer. Further, the first dielectric layer and the second dielectric layer are made from one or a combination of two or more of epoxy resin, silica gel, Polyimide (PI), Polybenzoxazole (PBO), Benzocyclobutene (BCB), silicon oxide, phosphorosilicate glass and fluorine-containing glass, and the first metal wiring layer and the second metal wiring layer are made from one or a combination of two or more of copper, aluminum, nickel, gold, silver and titanium.

As shown in FIG. 28, the second metal joint pin 107 is formed on the second surface of the redistribution layer 109, and is electrically connected with the redistribution layer 109.

The second metal joint pin 107 is made from a metal material like Au, Ag, Cu, and Al.

As shown in FIG. 28, the second packaging layer 108 covers the second metal joint pin 107 and the redistribution layer 109. Meanwhile, the second metal joint pin 107's top surface is exposed.

The second packaging layer 108 is made from one of polyimide, silica gel and epoxy resin. The top surface of the second packaging layer 108 is a grounded or polished flat surface, to improve the quality of the second antenna metal layer 106.

As shown in FIG. 28, the second antenna metal layer 106 is formed on the second packaging layer 108, and the second antenna metal layer 106 is electrically connected with the second metal joint pin 107.

The material of the second antenna metal layer 106 may be Au, or Cu, etc. The second antenna metal layer 106 may have various different patterns according to performance requirements.

As shown in FIG. 28, the second metal joint pin 107 is formed on the second antenna metal layer 106.

The second metal joint pin 107 is made from one of Au, Ag, Cu, and Al.

As shown in FIG. 28, the first packaging layer 105 covers the second antenna metal layer 106, and exposes the second metal joint pin 107, and the second metal joint pin 107 the top surface of the first packaging layer 105.

The first packaging layer 105 is made from one of polyimide, silica gel and epoxy resin. The top surface of the first packaging layer 105 is a ground or polished flat surface, so as to improve the quality of the first antenna metal layer 103.

As shown in FIG. 28, the first antenna metal layer 103 is formed on the first packaging layer 105, and the first antenna metal layer 103 protrudes from the surface of the first packaging layer 105. The second antenna metal layer 106 may be made from Au, Cu, etc., and the second antenna metal layer 106 may have various different patterns according to performance requirements.

As shown in FIG. 28, the metal bump 110 is formed on the first surface of the redistribution layer 109. The metal bump 110 comprises a solder material like f tin solder, silver solder and gold-tin alloy solder.

As shown in FIG. 28, the antenna circuit chip 111 is bonded to the first surface of the redistribution layer 109, and the antenna circuit chip 111 is electrically connected with the second antenna metal layer 106 and the first antenna metal layer 103 through the redistribution layer 109, the second metal joint pin 107 and the first metal joint pin 104, so as to realize the functions of the antenna. Based on the structure, an antenna packaging structure with more layers can be realized by more metal joint pins, packaging layers and antenna metal layers.

As shown in FIG. 28, the packaging structure further comprises a bottom filling layer 112 filled between the antenna circuit chip 111 and the redistribution layer 109 to increase the bonding strength of the antenna circuit chip 111 to the redistribution layer 109 and protect the redistribution layer 109.

Figure 15:
FIG. 15 to FIG. 27 show the steps of fabricating an antenna package and sequential structural diagrams according to another embodiment in the present disclosure.

As shown in FIG. 15 to FIG. 28, the embodiment further provides a packaging method for an antenna, comprising the following steps:

Step 1), providing a supporting substrate 101, and forming a separation layer 102 on the supporting substrate 101 as shown in FIG. 15.

As an example, the supporting substrate 101 may be one of a glass substrate, a metal substrate, a semiconductor substrate, a polymer substrate and a ceramic substrate. In the present embodiment, the supporting substrate 101 is a glass substrate, the cost of the glass substrate is lower than other types, it is easy to form the separation layer 102 on the surface of the glass substrate, and so it is easier for the subsequent separation process.

As an example, the separation layer 102 may be an adhesive tape or a polymer layer. In the case of a polymer layer, the polymer is first applied to the surface of the supporting substrate 101 by a spin-coating process, and then cured by a UV curing or thermal curing process.

In the present embodiment, the polymer layer comprises an LTHC photo-thermal conversion layer, and the LTHC photo-thermal conversion layer can be heated later in step 9) by laser light, so that a subsequently formed packaging layer 105 and the supporting substrate 101 are separated from each other at the LTHC photo-thermal conversion layer.

Figure 16:
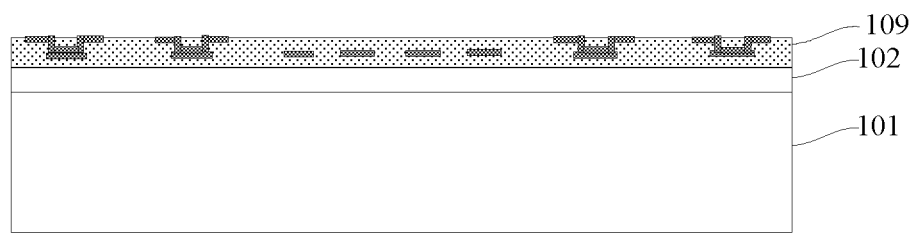

Step 2), forming a redistribution layer 109 on the separation layer 102, wherein the redistribution layer 109 comprises a first surface connected with the separation layer 102 and an opposite second surface, as shown in FIG. 16.

Forming the redistribution layer 109 of step 2) comprises the following steps:

step 2-1), forming a first dielectric layer as part of 109 on the surface of the separation layer 102 by a chemical vapor deposition process or a physical vapor deposition process, and etching the first dielectric layer to form a patterned first dielectric layer, wherein the first dielectric layer is made from one or a combination of two or more of epoxy resin, silica gel, PI, PBO, BCB, silicon oxide, phosphorosilicate glass and fluorine-containing glass;

step 2-2) forming a first metal layer (not shown) on the surface of the patterned first dielectric layer by a chemical vapor deposition process, an evaporation process, a sputtering process, an electroplating process, or an electroless plating process, and etching the first metal layer to form a patterned first metal wiring layer, wherein the first metal wiring layer is made from one or a combination of two or more of copper, aluminum, nickel, gold, silver and titanium;

step 2-3) forming a second dielectric layer on the surface of the patterned first metal wiring layer by a chemical vapor deposition process or a physical vapor deposition process, and etching the dielectric layer to form a patterned second dielectric layer, wherein the second dielectric layer is made from one or a combination of two or more of epoxy resin, silica gel, PI, PBO, BCB, silicon oxide, phosphorosilicate glass and fluorine-containing glass; and step 2-4) forming a second metal layer on the surface of the patterned second dielectric layer by a chemical vapor deposition process, an evaporation process, a sputtering process, an electroplating process, or an electroless plating process, and etching the second metal layer to form a patterned second metal wiring layer, wherein the second metal wiring layer is electrically connected with the first metal wiring layer. The second metal wiring layer is made from one or a combination of two or more of copper, aluminum, nickel, gold, silver, and titanium.

Figure 17:
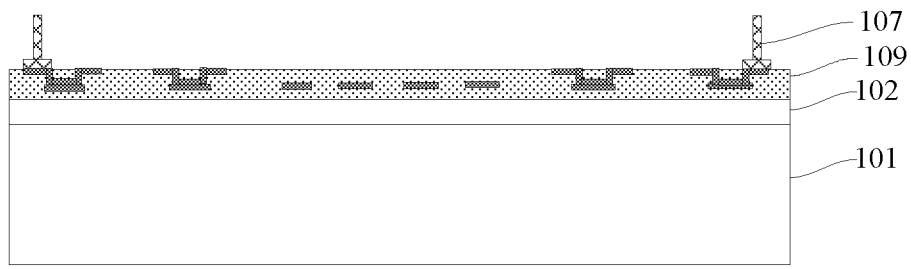

Step 3), forming a second metal joint pin 107 on the second surface of the redistribution layer 109, as shown in FIG. 17.

In step 3), the second metal joint pin 107 is manufactured by a wire bonding process, wherein the wire bonding process comprises one of a hot press wire bonding process, an ultrasonic wire bonding process and a hot press ultrasonic wire bonding process, and the second metal joint pin 107 is made from one of Au, Ag, Cu and Al.

Figure 18:
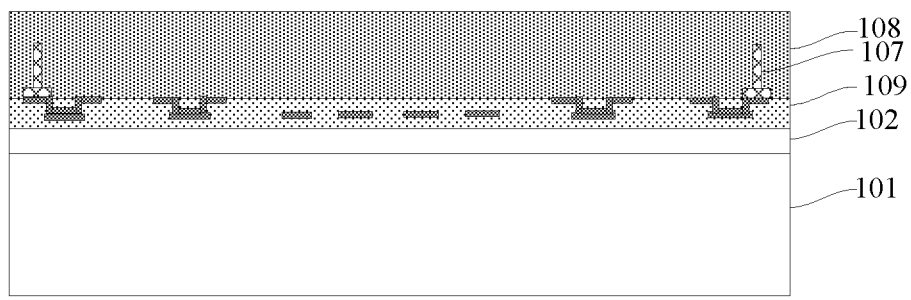
Figure 19:
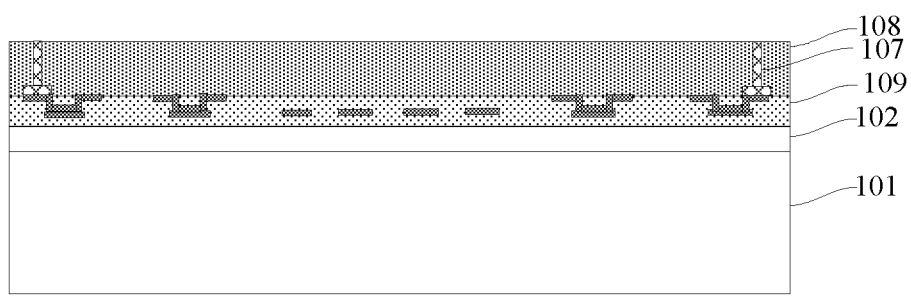

Step 4), packaging the second metal joint pin 107 and the redistribution layer 109 with a packaging layer 108, and then grinding the second packaging layer 108 until the second metal joint pin 107 is exposed from the top surface of the second packaging layer 108, as shown in FIG. 18 to FIG. 19.

Packaging the second metal joint pin 107 and the redistribution layer 109 with the second packaging layer 108 in step 4) adopts one of the following methods: compression molding, transfer molding, liquid seal molding, vacuum lamination and spin coating, and the second packaging layer 108 is made from one of polyimide, silica gel and epoxy resin.

Figure 20:
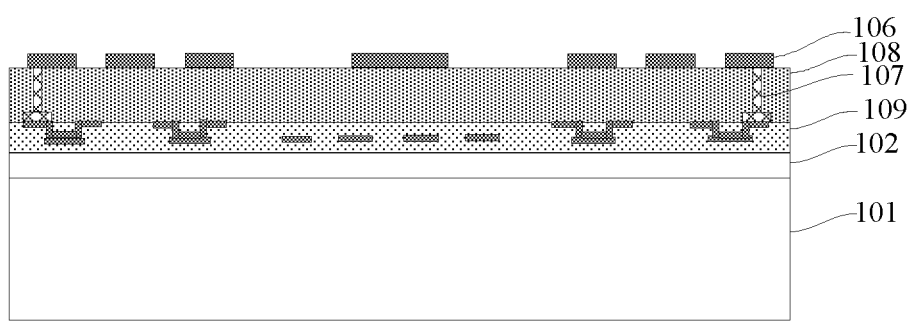

Step 5), forming a second antenna metal layer 106 on the surface of the second packaging layer 108, wherein the second antenna metal layer 106 is electrically connected with the second metal joint pin 107, as shown in FIG. 20.

For example, a metal layer may be formed on the surface of the second packaging layer 108 by evaporation or sputtering, and then the metal layer is patterned to form the second antenna metal layer 106 by an etching process. Optionally, the second antenna metal layer 106 may also be formed by a metal lift-off process, that is, forming a photoresist pattern on the surface of the second packaging layer 108 first, then forming a metal layer on the photoresist pattern by an evaporation or sputtering method, and finally removing the photoresist pattern and separating the metal layer from the photoresist pattern, with the patterned antenna metal layer 106 left on the surface of the second packaging layer 108.

Figure 21:
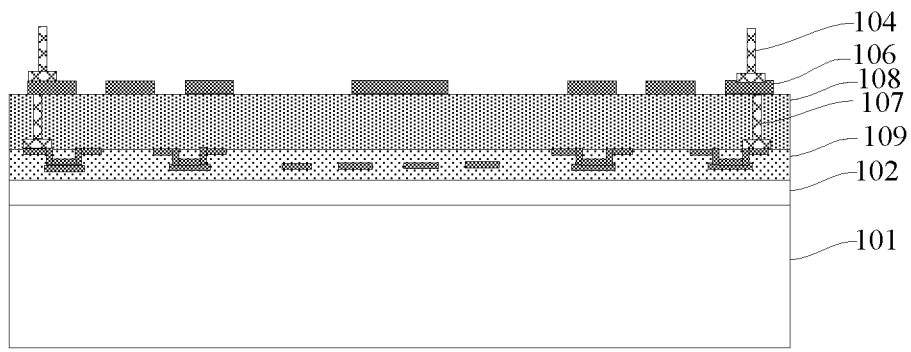

Step 6), forming a first metal joint pin 104 on the second antenna metal layer 106, as shown in FIG. 21.

In step 6), the first metal joint pin 104 is manufactured by a wire bonding process, wherein the wire bonding process is one of a hot press wire bonding process, an ultrasonic wire bonding process and a hot press ultrasonic wire bonding process, and the first metal joint pin 104 is made from one of Au, Ag, Cu and Al.

Figure 22:
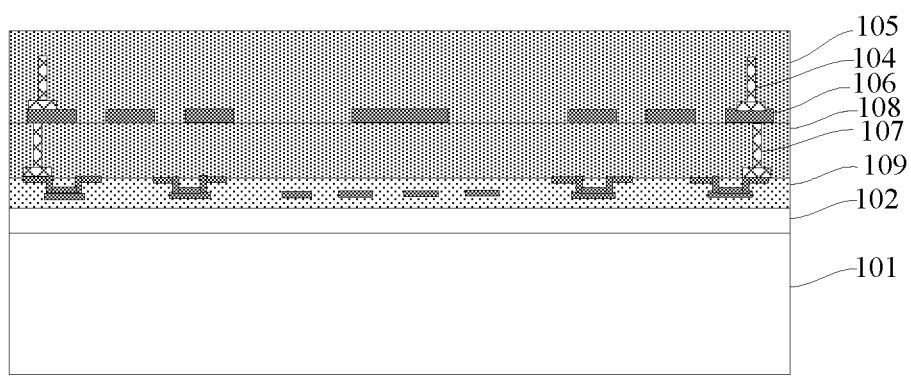
Figure 23:
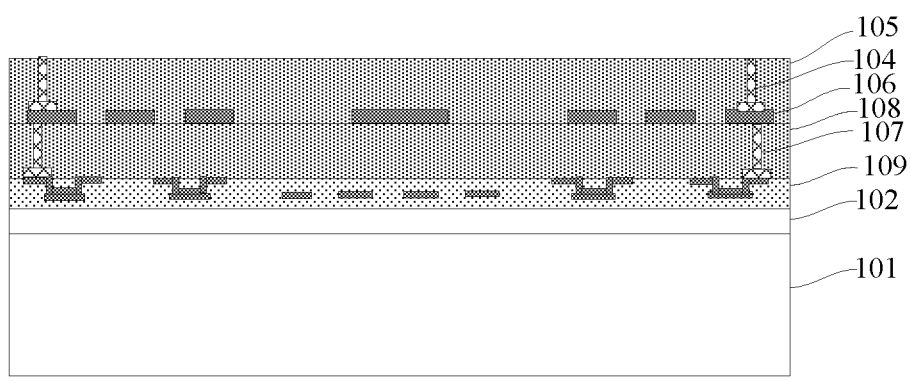

Step 7), packaging the second antenna metal layer 106 and the first metal joint pin 104 with a packaging layer 105, and then grinding the first packaging layer 105 until the first metal joint pin 104 is exposed from the top surface of the first packaging layer 105, as shown in FIG. 22 to FIG. 23.

Step 7) of packaging the second antenna metal layer 106 and the first metal joint pin 104 with a packaging layer 105 adopts one of the following methods: compression molding, transfer molding, liquid seal molding, vacuum lamination and spin coating, and the first packaging layer 105 is made from one of polyimide, silica gel and epoxy resin.

Figure 24:
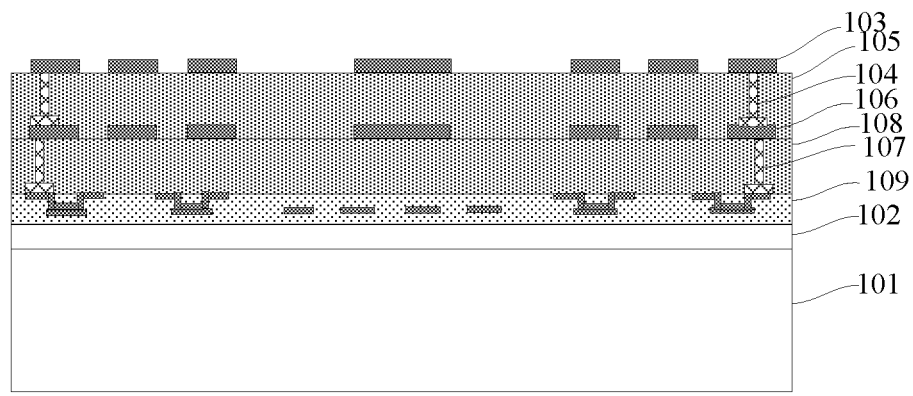

Step 8), forming an antenna metal layer 103 on the surface of the first packaging layer 105, as shown in FIG. 24.

For example, a metal layer may be formed on the surface of the first packaging layer 105 by evaporation or sputtering method first, and the metal layer is patterned to form the first antenna metal layer 103 by an etching process. Of course, the first antenna metal layer 103 may also be formed by a metal lift-off process, that is, forming a photoresist pattern on the surface of the first packaging layer 105 first, then forming a metal layer on the photoresist pattern by an evaporation or sputtering method, and finally removing the photoresist pattern and separating the metal layer from the photoresist pattern, with the patterned antenna metal layer 103 left on the surface of the first packaging layer 105.

Figure 25:
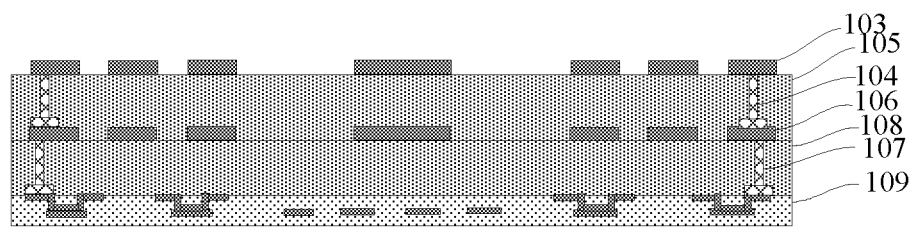

Step 9), separating the redistribution layer 109 from the supporting substrate 101 based on the separation layer 102 to expose the first surface of the redistribution layer 109, as shown in FIG. 25.

For example, the LTHC photo-thermal conversion layer is heated by laser light, so that the subsequently formed packaging layer 105 and the supporting substrate 101 are separated from each other at the LTHC photo-thermal conversion layer.

Figure 26:
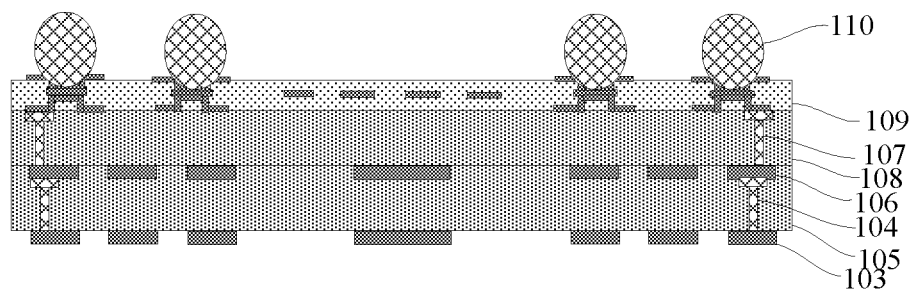

Step 10), forming a metal bump 110 on the first surface of the redistribution layer 109, as shown in FIG. 26.

The metal bump 110 comprises one of tin solder, silver solder and gold-tin alloy solder.

Figure 27:
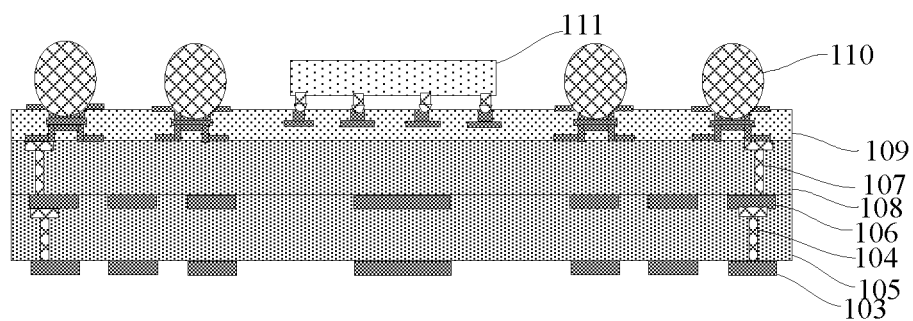

Step 11) and step 12) providing an antenna circuit chip 111, bonding the antenna circuit chip 111 to the first surface of the redistribution layer 109, and finally forming a bottom filling layer 112 between the antenna circuit chip 111 and the redistribution layer 109 to increase the bonding strength of the antenna circuit chip 111 and the redistribution layer 109 and protect the redistribution layer 109, as shown in FIG. 27 to FIG. 28.

Embodiment 2

As shown in FIG. 1 to FIG. 14, the present embodiment provides a packaging method for an antenna, comprising the following steps:

Step 1), providing a supporting substrate 101, and forming a separation layer 102 on the supporting substrate 101, as shown in FIG. 1.

As an example, the supporting substrate 101 comprises one of a glass substrate, a metal substrate, a semiconductor substrate, a polymer substrate and a ceramic substrate. In the present embodiment, the supporting substrate 101 is a glass substrate, the cost of the glass substrate is low, it is easy to form the separation layer 102 on the surface of the glass substrate, and the difficulty of the subsequent separation process can be reduced.

As an example, the separation layer 102 comprises one of an adhesive tape and a polymer layer. The polymer layer is first applied to the surface of the supporting substrate 101 by a spin-coating process, and then cured by a UV curing or thermal curing process.

The polymer layer comprises an LTHC photo-thermal conversion layer, and the LTHC photo-thermal conversion layer can be heated later in step 11) by laser light, so that the first packaging layer 105 and the supporting substrate 101 are separated from each other at the LTHC photo-thermal conversion layer.

Figure 2:
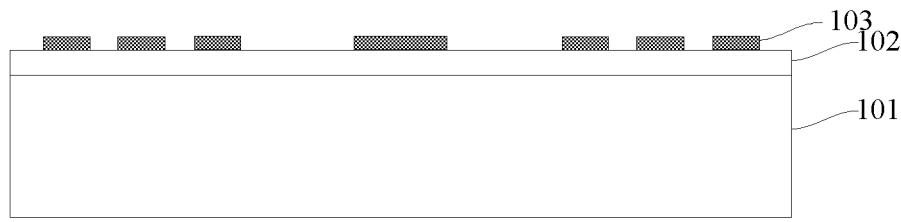

Step 2), forming an antenna metal layer 103 on the separation layer 102, as shown in FIG. 2.

For example, a metal layer may be formed on the surface of the separation layer 102 by an evaporation or sputtering method first, and then the metal layer is patterned form the first antenna metal layer 103 by an etching process. Optionally, the first antenna metal layer 103 may also be formed by a metal lift-off process, that is, forming a photoresist pattern on the surface of the separation layer 102 first, then forming a metal layer on the photoresist pattern by an evaporation or sputtering method, and finally removing the photoresist pattern and separating the metal layer from the photoresist pattern, with the patterned antenna metal layer 103 left on the surface of the separation layer 102.

Figure 3:
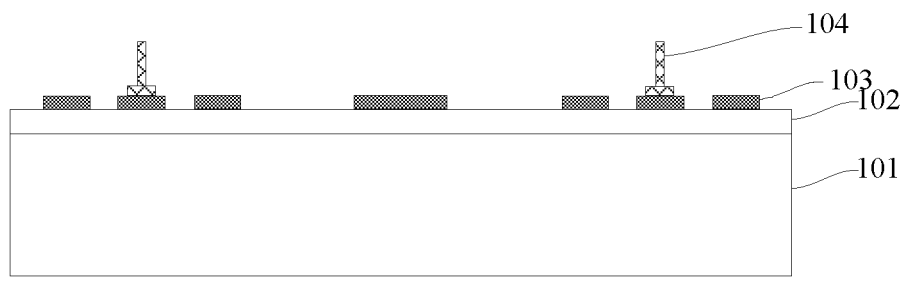

Step 3), forming a first metal joint pin 104 on the first antenna metal layer 103, as shown in FIG. 3.

The first metal joint pin 104 is manufactured by a wire bonding process, wherein the wire bonding process is one of a hot press wire bonding process, an ultrasonic wire bonding process and a hot press ultrasonic wire bonding process, and the first metal joint pin 104 is made from one of Au, Ag, Cu, and Al.

Figure 4:
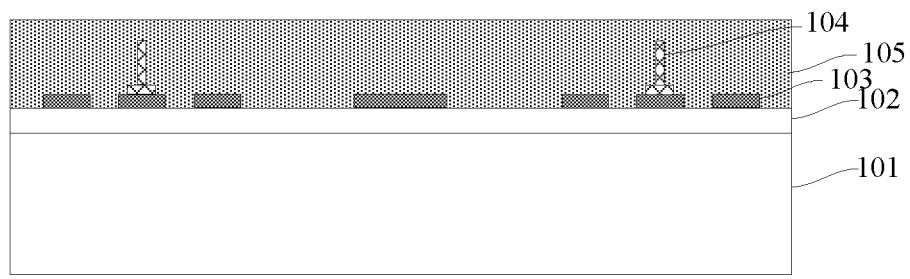
Figure 5:
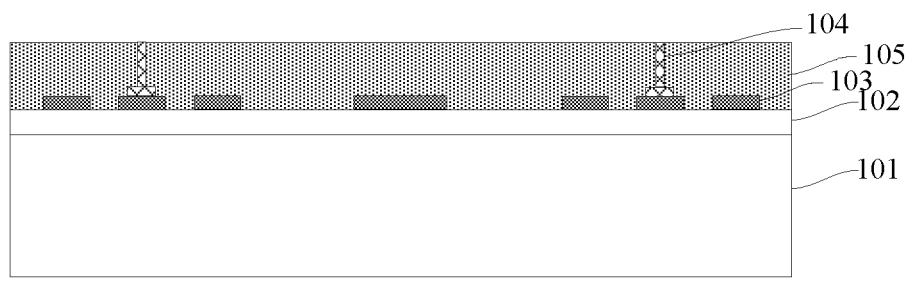

Step 4), packaging the first antenna metal layer 103 and the first metal joint pin 104 with a packaging layer 105, so that the first metal joint pin 104 is exposed from the top surface of the first packaging layer 105, as shown in FIG. 4 to FIG. 5.

The packaging of the first antenna metal layer 103 and the first metal joint pin 104 with a packaging layer 105 adopts one of the following methods: compression molding, transfer molding, liquid seal molding, vacuum lamination and spin coating, and the first packaging layer 105 is made from one of polyimide, silica gel and epoxy resin.

Figure 6:
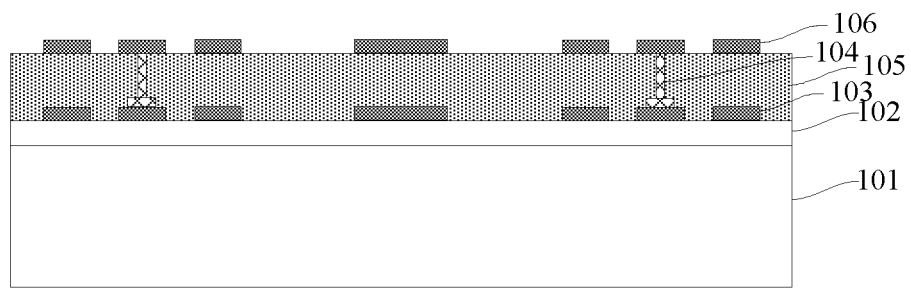

Step 5), forming an antenna metal layer 106 on the surface of the first packaging layer 105, wherein the second antenna metal layer 106 is electrically connected with the first metal joint pin 104, as shown in FIG. 6.

Figure 7:
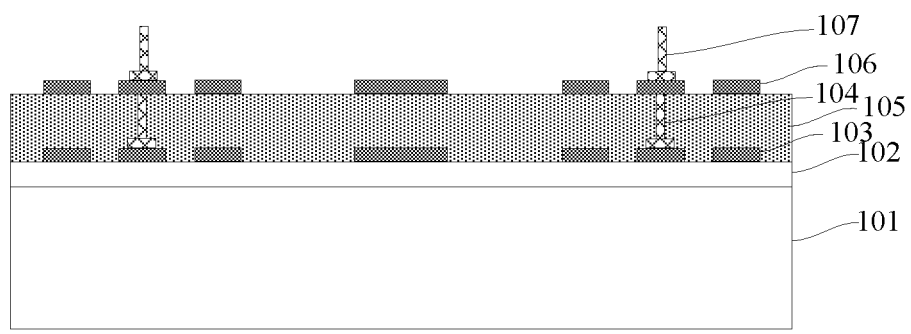

Step 6), forming a second metal joint pin 107 on the second antenna metal layer 106, as shown in FIG. 7.

The second metal joint pin 107 is manufactured by a wire bonding process, wherein the wire bonding process is one of a hot press wire bonding process, an ultrasonic wire bonding process and a hot press ultrasonic wire bonding process, and the first metal joint pin 107 and second metal joint pin 107 are made from one of Au, Ag, Cu and Al.

Figure 8:
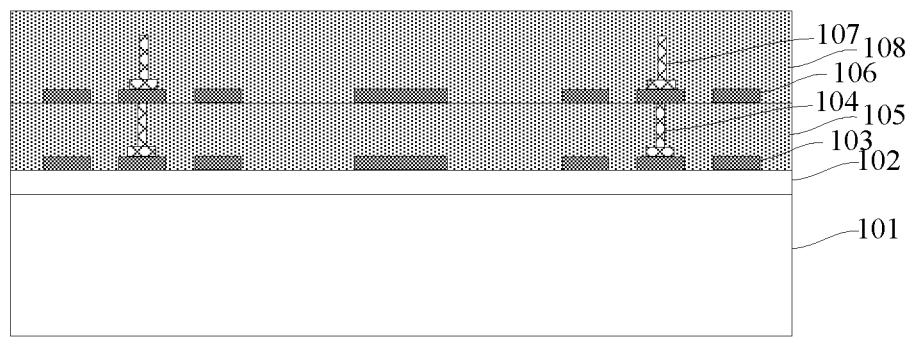
Figure 9:
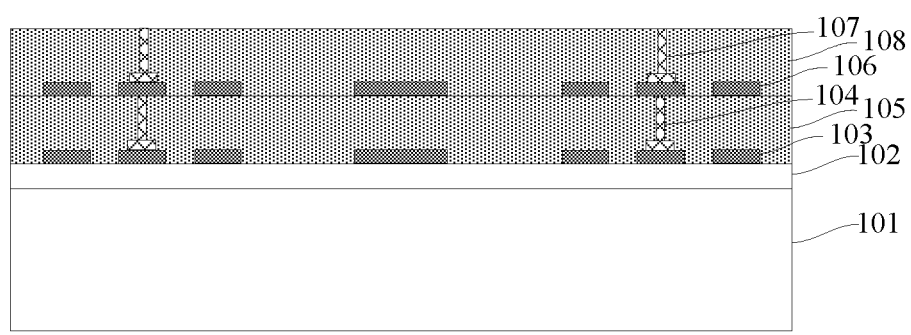

Step 7), packaging the second antenna metal layer 106 and second metal joint pin 107 with a packaging layer 108, so that second metal joint pin 107 is exposed from the top surface of the second packaging layer 108, as shown in FIG. 8 to FIG. 9.

The packaging of the second antenna metal layer 106 and second metal joint pin 107 with a packaging layer 108 adopts one of the following methods: compression molding, transfer molding, liquid seal molding, vacuum lamination and spin coating, and the second packaging layer 108 is made from one of polyimide, silica gel and epoxy resin.

Figure 10:
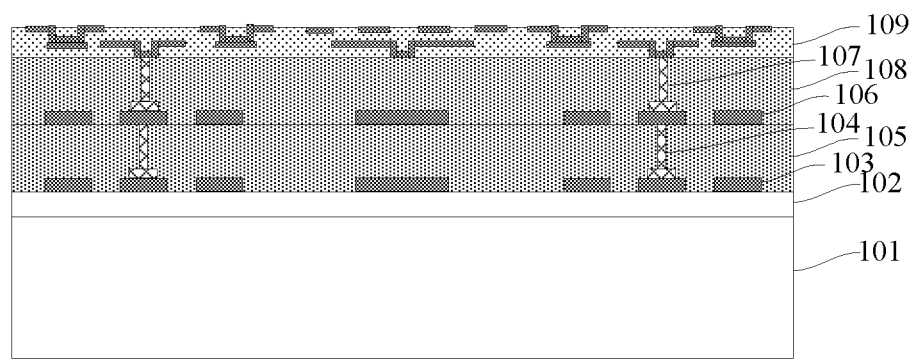

Step 8), forming a redistribution layer 109 on the surface of the second packaging layer 108, wherein the redistribution layer 109 is electrically connected with second metal joint pin 107, As shown in FIG. 10.

Step 8) of forming the redistribution layer 109 comprises the following steps:

8-1), forming a first dielectric layer on the surface of the second packaging layer 108 by a chemical vapor deposition process or a physical vapor deposition process, and etching the first dielectric layer to form a patterned first dielectric layer;

8-2) forming a first metal layer on the surface of the patterned first dielectric layer by a chemical vapor deposition process, an evaporation process, a sputtering process, an electroplating process, or an electroless plating process, and etching the first metal layer to form a patterned first metal wiring layer, wherein the first metal wiring layer is electrically connected with second metal joint pin 107;

8-3) forming a second dielectric layer on the surface of the patterned first metal wiring layer by a chemical vapor deposition process or a physical vapor deposition process, and etching the dielectric layer to form a patterned second dielectric layer; and 8-4) forming a second metal layer on the surface of the patterned second dielectric layer by a chemical vapor deposition process, an evaporation process, a sputtering process, an electroplating process, or an electroless plating process, and etching the second metal layer to form a patterned second metal wiring layer, wherein the second metal wiring layer is electrically connected with the first metal wiring layer.

The first dielectric layer and the second dielectric layer are made from one or a combination of two or more of epoxy resin, silica gel, PI, PBO, BCB, silicon oxide, phosphorosilicate glass and fluorine-containing glass, and the first metal wiring layer and the second metal wiring layer are made from one or a combination of two or more of copper, aluminum, nickel, gold, silver and titanium.

Figure 11:
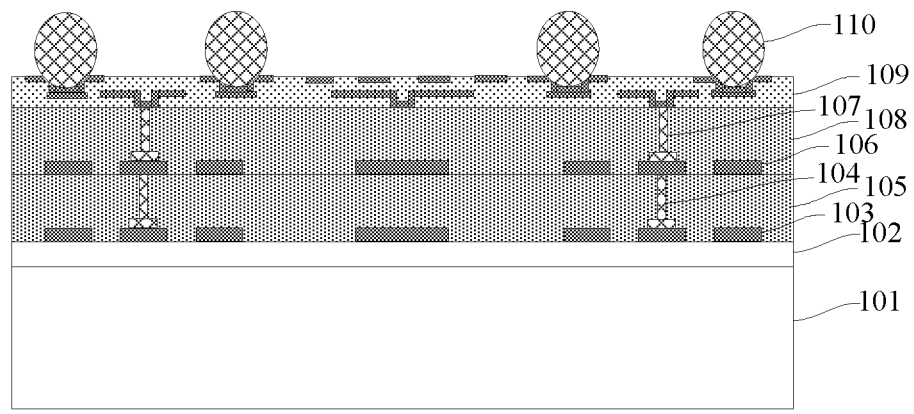

Step 9), forming a metal bump 110 on the redistribution layer 109, as shown in FIG. 11.

The metal bump 110 comprises one of tin solder, silver solder and gold-tin alloy solder.

Figure 12:
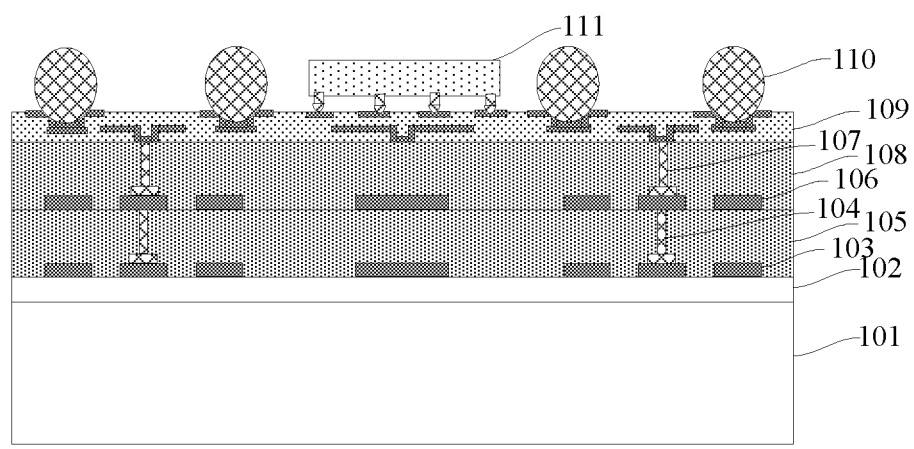

Step 10), providing an antenna circuit chip 111, and bonding the antenna circuit chip 111 to the redistribution layer 109, as shown in FIG. 12.

Between step 10) and step 11), the packaging method further comprises: forming a bottom filling layer 112 between the antenna circuit chip 111 and the redistribution layer 109 to increase the bonding strength of the antenna circuit chip 111 and the redistribution layer 109 and protect the redistribution layer 109.

Figure 13:
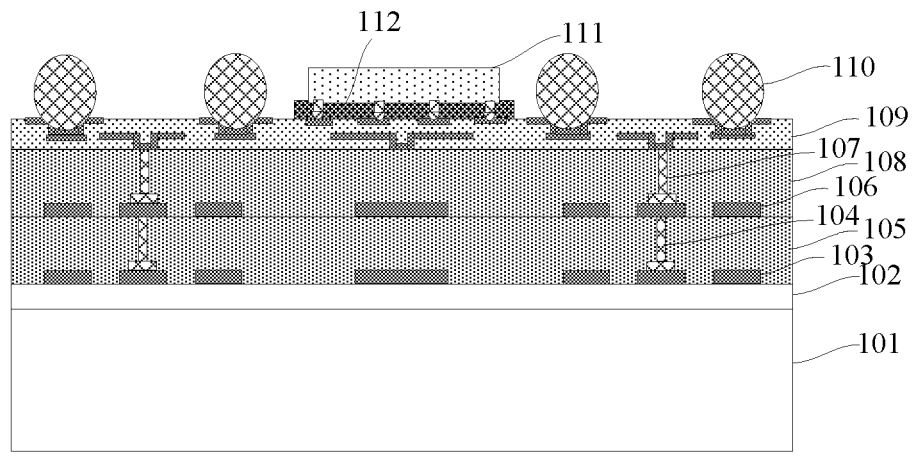
Figure 14:
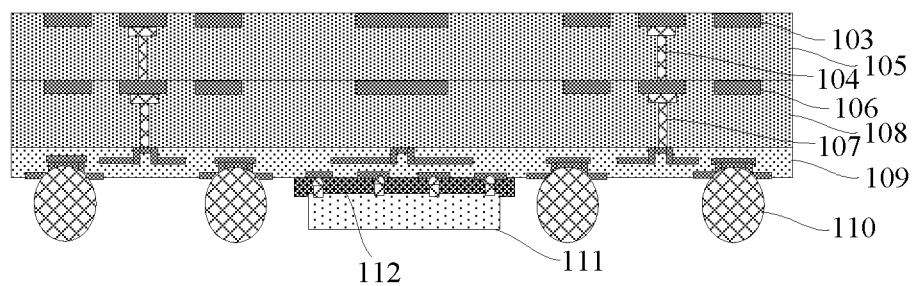

Step 11), separating the first packaging layer 105 from the supporting substrate 101 based on the separation layer 102, as shown in FIG. 13 to FIG. 14.

As shown in FIG. 14, the present embodiment further provides a packaging structure for an antenna. The basic structure is the same as that of embodiment 1, and the main difference from embodiment 1 lies in that the first antenna metal layer 103 of the packaging structure sinks into the first packaging layer 105, such that the side face of the first antenna metal layer 103 is covered by the first packaging layer 105, which can greatly improve the mechanical stability of the first antenna metal layer 103 and improve the overall performance of the packaging structure.

The disclosed device have the following benefits:

the packaging structure for an antenna according to the present disclosure adopts the redistribution layer to realize the integration of two or more antenna metal layers, greatly improving the efficiency and performance of the antenna, and the packaging structure and packaging method for an antenna according to the present disclosure have a high integration level; and in the present disclosure, a fan-out packaging method is adopted to package the antenna, which can effectively reduce the packaging volume, and make the packaging structure for an antenna have a high integration level and better packaging performance, thereby having a wide application prospect in the field of semiconductor packaging.

Therefore, the present disclosure effectively overcomes various disadvantages in the prior art and has high industrial utilization value.

The above-described embodiments merely illustrate the principles and effects of the present disclosure, but are not intended to limit the present disclosure. Any person skilled in the art can modify or change the above embodiments without departing from the spirit and scope of the present disclosure. Therefore, all equivalent modifications or changes made by persons of ordinary skill in the art without departing from the spirit and technical thought disclosed in the present disclosure shall still be covered by the claims of the present disclosure.

What is claimed is:

1. A method for fabricating an antenna feeder package, comprising:

providing a supporting substrate having a separation layer on the supporting substrate;

forming a patterned first antenna metal layer on the separation layer;

mounting a first metal joint pin on the patterned first antenna metal layer by using a wire bonding process;

depositing a first packaging layer to cover the first metal joint pin;

polishing the first packaging layer to expose a top surface of the first metal joint pin;

forming a patterned second antenna metal layer directly contacting the top surface of the first metal joint pin;

mounting a second metal joint pin on the patterned second antenna metal layer by using the wire bonding process;

depositing a second packaging layer to cover the second metal joint pin;

polishing the second packaging layer to expose a top surface of the second metal joint pin;

forming a first portion of a conductive redistribution layer, wherein the first portion is in direct contact with the top surface of the second metal joint pin;

forming a second portion of the conductive redistribution layer, wherein the second portion is in direct contact with a metal solder ball;

forming a third portion of the conductive redistribution layer, wherein the third portion is in direct contact with pads of an antenna circuit chip, wherein a bottom filling layer is disposed outside the pads and between the third portion of the conductive redistribution layer and the antenna circuit chip; and remove the supporting substrate by peeling off the separation layer.

2. The method for fabricating an antenna feeder package according to claim 1, wherein the wire bonding process comprises one of a thermos-compression bonding process, an ultrasonic wire bonding process, and a thermos-compression ultrasonic wire bonding process.

3. The method for fabricating an antenna feeder package according to claim 1, wherein depositing the first packaging layer to cover the first metal joint pin and depositing the second packaging layer to cover the second metal joint pin each comprises one of compression molding, transfer molding, hydro-forming, vacuum lamination and spin coating.

4. The method for fabricating an antenna feeder package according to claim 1, wherein each of polishing the first packaging layer to expose the top surface of the first metal joint pin and polishing the second packaging layer to expose the top surface of the second metal joint pin comprises grinding or planarization by polishing.

* * * * *

UNITED STATES PATENT AND TRADEMARK OFFICE
CERTIFICATE OF CORRECTION

PATENT NO. : 10,777,876 B2
APPLICATION NO. : 16/354477
DATED : September 15, 2020
INVENTOR(S) : Jangshen Lin et al.

It is certified that error appears in the above-identified patent and that said Letters Patent is hereby corrected as shown below:

On the Title Page

Please insert item (30):
--(30) Foreign Application Priority Data
Mar. 16, 2018 (CN) ................. 201811325951.0
Mar. 16, 2018 (CN) ................. 201820359825.6
Mar. 16, 2018 (CN) ................. 201810217588.4--

Signed and Sealed this
Fourth Day of June, 2024

Katherine Kelly Vidal
*Director of the United States Patent and Trademark Office*